United States Patent
Wang et al.

(10) Patent No.: US 10,435,572 B2
(45) Date of Patent: Oct. 8, 2019

(54) INKJET INK COMPOSITION, INK COATING METHOD, AND COATED ARTICLE

(71) Applicant: CORNING INCORPORATED, Corning, NY (US)

(72) Inventors: Fang-Fang Wang, Chu-Bei (TW); Ruei-ming Huang, Kaohsiung (TW); Yongsheng Yan, Fuzhou (CN)

(73) Assignee: CORNING INCORPORATED, Corning, NJ (US)

( * ) Notice: Subject to any disclaimer, the term of this patent is extended or adjusted under 35 U.S.C. 154(b) by 383 days.

(21) Appl. No.: 15/071,936

(22) Filed: Mar. 16, 2016

(65) Prior Publication Data

US 2016/0272826 A1 Sep. 22, 2016

Related U.S. Application Data

(60) Provisional application No. 62/135,864, filed on Mar. 20, 2015.

(51) Int. Cl.

| | |
|---|---|
| *C09D 11/033* | (2014.01) |
| *C09D 11/106* | (2014.01) |
| *C09D 11/322* | (2014.01) |
| *C09D 11/36* | (2014.01) |
| *C09D 11/38* | (2014.01) |
| *H05K 1/09* | (2006.01) |
| *H05K 3/12* | (2006.01) |

(52) U.S. Cl.
CPC .......... *C09D 11/033* (2013.01); *C09D 11/106* (2013.01); *C09D 11/322* (2013.01); *C09D 11/36* (2013.01); *C09D 11/38* (2013.01); *H05K 1/097* (2013.01); *H05K 3/125* (2013.01); *H05K 2201/0323* (2013.01); *H05K 2203/013* (2013.01)

(58) Field of Classification Search
CPC ....................................................... C09D 11/30
See application file for complete search history.

(56) References Cited

U.S. PATENT DOCUMENTS

| | | | |
|---|---|---|---|
| 5,843,219 A | 12/1998 | Griffin et al. | |
| 5,888,287 A | 3/1999 | Brown et al. | |
| 6,231,654 B1 | 5/2001 | Elwakil | |
| 6,309,452 B1 | 10/2001 | Beach et al. | |
| 6,730,149 B2 | 5/2004 | Arita et al. | |
| 6,827,772 B2 | 12/2004 | Foster | |
| 6,881,250 B2 | 4/2005 | Wong et al. | |
| 7,488,763 B2 | 2/2009 | Ushiku et al. | |

(Continued)

FOREIGN PATENT DOCUMENTS

| | | |
|---|---|---|
| CA | 2286446 | 1/2007 |
| EP | 2290452 | 3/2011 |

(Continued)

*Primary Examiner* — Scott R. Walshon
*Assistant Examiner* — Sathavaram I Reddy
(74) *Attorney, Agent, or Firm* — John P. McGroarty

(57) ABSTRACT

An inkjet ink composition, inkjet ink coating method, and resulting jet ink coated article are all predicated upon the jet ink composition which includes a particulate pigment material, an inorganic resin component, and a solvent composition. Upon thermal cure, the uncured resin composition forms a cured resin composition with superior adhesion to substrates such as but not limited to glass substrates, ceramic substrates and metal oxide substrates.

33 Claims, 1 Drawing Sheet

(56) References Cited

U.S. PATENT DOCUMENTS

| | | | |
|---|---|---|---|
| 7,786,209 B2* | 8/2010 | Carlini | C07F 7/21 523/160 |
| 7,947,761 B2 | 5/2011 | Shakhnovich et al. | |
| 7,959,725 B2 | 6/2011 | Yamamoto et al. | |
| 8,251,503 B2 | 8/2012 | Kawashima | |
| 8,328,345 B2 | 12/2012 | Watanabe et al. | |
| 8,474,964 B2 | 7/2013 | Saito et al. | |
| 8,778,074 B2 | 7/2014 | Brown et al. | |
| 2004/0214920 A1 | 10/2004 | Aoshima | |
| 2005/0165135 A1 | 7/2005 | Mozel et al. | |
| 2010/0047457 A1* | 2/2010 | Bentley | C09D 11/101 427/280 |
| 2010/0155103 A1* | 6/2010 | Kamikoriyama | C09D 11/38 174/126.1 |
| 2010/0243149 A1* | 9/2010 | Hashimoto | H05K 1/0265 156/272.8 |
| 2011/0190427 A1* | 8/2011 | Isobe | C09D 11/322 524/88 |
| 2011/0230603 A1 | 9/2011 | Yoda et al. | |
| 2012/0210908 A1 | 8/2012 | Endo et al. | |
| 2012/0281034 A1* | 11/2012 | De Meutter | B41M 7/009 347/6 |
| 2014/0135432 A1 | 5/2014 | Nishimoto et al. | |
| 2016/0002479 A1 | 7/2016 | Chen et al. | |

FOREIGN PATENT DOCUMENTS

| | | |
|---|---|---|
| JP | 2002204079 | 7/2002 |
| JP | 2009070677 | 4/2009 |
| JP | 2012201703 | 10/2012 |

* cited by examiner

INKJET INK COMPOSITION, INK COATING METHOD, AND COATED ARTICLE

CROSS-REFERENCE TO RELATED APPLICATIONS

This application claims the benefit of priority under 35 U.S.C. § 119 of U.S. Provisional Application Ser. No. 62/135,864 filed on Mar. 20, 2015 the content of which is relied upon and incorporated herein by reference in its entirety.

FIELD OF THE INVENTION

The present disclosure is directed generally to inkjet ink compositions, inkjet-printed articles, and inkjet printing methods.

BACKGROUND

Inkjet ink compositions for inkjet ink printing processes are well known materials that often provide precise and reproducible images on porous substrates such as paper stock substrates. Unfortunately, when applied to less porous substrates such as glass substrates, ink image adhesion and opacity are often compromised. For example, issues with ink adhesion to a less porous substrate like glass can lead to poor color density and image clarity, particularly with color inks.

Accordingly, there is a need in the art for inkjet ink compositions and printing methods that provide enhanced glass substrate adhesion properties and enhanced opacity properties.

SUMMARY OF THE INVENTION

The present disclosure is directed to inventive inkjet ink compositions and printing methods that provide enhanced substrate adhesion properties and enhanced opacity properties. Embodiments described or otherwise envisioned herein are directed to inkjet ink compositions with a pigment component, a resin composition and a solvent composition that provide the cured inkjet ink composition with enhanced adhesion and enhanced opacity with respect to a substrate surface, in particular under circumstances where the substrate surface comprises a glass surface, a ceramic surface, a metal oxide surface, a metal surface, a polymeric surface, or similar surfaces. Similarly, embodiments of the method described or otherwise envisioned herein are directed to inkjet printing an ink composition with a pigment component, a resin composition and a solvent composition onto a substrate surface, such as a glass surface, a ceramic surface, a metal oxide surface, a metal surface, a polymeric surface, or similar surfaces.

For example, in some embodiments, an uncured resin composition within an uncured inkjet ink composition comprises an uncured silicone resin component, which in accord with further description below may alternatively be described as a silsesquioxane material component. Further, a solvent composition within an uncured inkjet ink composition in accordance with an embodiment can comprise: (1) a propylene-glycol-ether; and (2) diethylene-glycol-dimethyl-ether, among many other components.

In one aspect, an inkjet ink composition includes: (i) a pigment material; (ii) an inorganic resin component; and (iii) a solvent composition comprising a propylene-glycol-ether and diethylene-glycol-dimethyl-ether.

According to an embodiment, the solvent further comprises propylene-glycol-methyl-ether-acetate.

According to an embodiment, the solvent further comprises polypropylene-glycol-monomethyl-ether-acetate.

According to an embodiment, the solvent further comprises diethylene-glycol-diethyl-ether.

According to an embodiment, the propylene-glycol-ether is propylene-glycol-monomethyl-ether and/or polypropylene-glycol-methyl-ether.

According to an embodiment, inkjet ink composition also includes a dispersant and/or a flow promoter.

According to an embodiment, the pigment is black, cyan, magenta, yellow, and combinations thereof, among others.

According to an embodiment, the inorganic resin component is a silsesquioxane, such as divinyl-hexamethyl-octasila-silsesquioxane.

According to an embodiment, the flow promoter is polyether-modified methylalkylpolysiloxane and/or modified polyether polydimethylsiloxane.

According to an embodiment, the pigment material is present at approximately 0.5 to 5 weight percent, the dispersant is present at approximately 0.5 to 4.0 weight percent, the inorganic resin component is present at approximately 20 to 35 weight percent, the solvent composition comprises: (i) a propylene-glycol-ether present at approximately 10 to 55 weight percent; and diethylene-glycol-dimethyl-ether present at approximately 10 to 25 weight percent; and the flow promoter is present at approximately 0.5 to 3.5 weight percent.

According to an embodiment, the inkjet ink composition further includes an additive such as a resin strengthener, which may be present at up to approximately 3 weight percent.

According to an embodiment, the inkjet ink composition has a viscosity from about 4 to about 6 centipoise at about 25 degrees Celsius.

In one aspect, an ink coating method comprising the steps of: coating upon a substrate an uncured inkjet ink composition including: (i) a pigment material; (ii) an inorganic resin component; and (iii) a solvent composition having a propylene-glycol-ether and diethylene-glycol-dimethyl-ether; and curing in-situ the uncured inkjet ink composition to form a cured ink composition upon the substrate.

According to an embodiment of the method, the uncured inkjet ink composition also includes a dispersant and/or a flow promoter.

According to an embodiment of the method, the pigment material is present at approximately 0.5 to 5 weight percent; the dispersant is present at approximately 0.5 to 4.0 weight percent; the inorganic resin component is present at approximately 20 to 35 weight percent; the solvent composition comprises: (i) a propylene-glycol-ether present at approximately 40 to 55 weight percent; (ii) diethylene-glycol-dimethyl-ether present at approximately 10 to 55 weight percent; and the flow promoter is present at approximately 0.5 to 3.5 weight percent.

According to an embodiment, the inorganic resin component is or includes divinyl-hexamethyl-octasila-silsesquioxane.

According to an embodiment, the flow promoter is or includes polyether-modified methylalkylpolysiloxane and/or modified polyether polydimethylsiloxane.

According to an embodiment, the substrate is a glass substrate, a ceramic substrate, a metal oxide substrate, a metal substrate, and/or a polymeric substrate.

According to an embodiment, the uncured ink composition is thermally cured at a temperature of approximately 160 to 250 degrees Celsius, for a time period of approximately 1 to 20 minutes.

In one aspect, a coated article includes a substrate, and a cured coating located upon the substrate, the cured coating including: (i) a pigment material; (ii) an inorganic resin component; and (iii) a solvent composition having a propylene-glycol-ether and diethylene-glycol-dimethyl-ether.

According to an embodiment, the inorganic resin component is or includes divinyl-hexamethyl-octasila-silsesquioxane.

According to an embodiment, the cured coating also includes a dispersant and/or a flow promoter.

According to an embodiment, the flow promoter is or includes polyether-modified methylalkylpolysiloxane and/or modified polyether polydimethylsiloxane.

According to an embodiment, the substrate is a glass substrate, a ceramic substrate, a metal oxide substrate, a metal substrate, and/or a polymeric substrate.

According to an embodiment, the cured coating has a thickness of approximately 2 to 6 microns.

These and other aspects of the invention will be apparent from and elucidated with reference to the embodiment(s) described hereinafter.

BRIEF DESCRIPTION OF THE DRAWINGS

The objects, features and advantages of the embodiments are understood within the context of the Detailed Description, as set forth below. The Detailed Description is understood within the context of the accompanying drawings, where like reference characters generally refer to the same parts throughout the different views. Also, the drawings are not necessarily to scale, emphasis instead generally being placed upon illustrating the principles of the invention.

DETAILED DESCRIPTION

Figure 1:
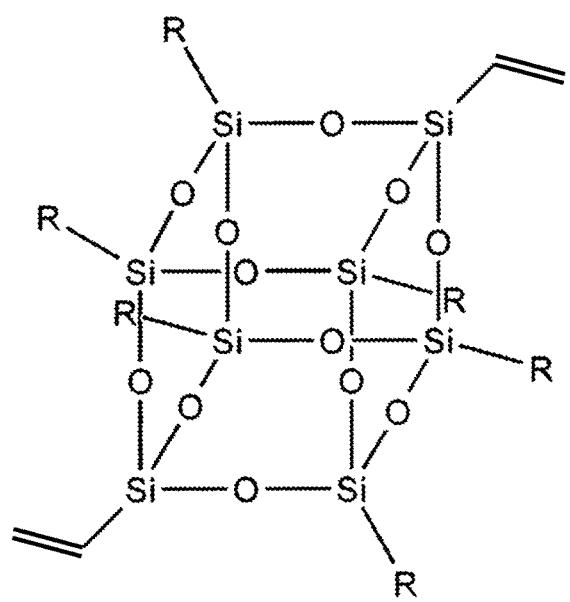
FIG. 1 is a schematic representation of the chemical structure of a divinyl-hexamethyl-octasila-silsesquioxane resin component, in accordance with an embodiment.

Embodiments described or otherwise envisioned herein are directed to inventive inkjet ink compositions and printing methods that provide enhanced substrate adhesion properties and enhanced opacity properties. According to various embodiments, the inkjet ink compositions include a pigment component, a resin composition, and a solvent composition that provide the cured inkjet ink composition with enhanced adhesion and enhanced opacity with respect to a substrate surface, in particular under circumstances where the substrate surface comprises a glass surface, a ceramic surface, a metal oxide surface, a metal surface, a polymeric surface, or similar surfaces. According to various embodiments, the inkjet printing methods described herein utilize a series of steps to inkjet an ink composition with a pigment component, a resin composition and a solvent composition onto a substrate surface, such as a glass surface, a ceramic surface, a metal oxide surface, a metal surface, a polymeric surface, or similar surfaces.

Accordingly, the inkjet ink composition comprises an uncured silicone resin component, which in accord with further description below may alternatively be described as a silsesquioxane material component. Further, in accordance with various embodiments the inkjet ink composition comprises a solvent composition comprising: (1) a propylene-glycol-ether; and (2) diethylene-glycol-dimethyl-ether. The inkjet ink composition further comprises a pigment and a flow promoter additive. In addition to these components, the inkjet ink composition can further comprise one or more additional elements as described or otherwise envisioned herein.

Inkjet Ink Compositions

A first of the primary components of an uncured inkjet ink composition in accordance with an embodiment is a pigment material that may comprise, but is not limited to, a carbon black particulate pigment material. Thus, in addition to a black uncured inkjet ink composition, various embodiment also in general contemplate colored uncured inkjet ink compositions, in particular comprising a color or colors selected from the group including but not limited to red, green, and blue, or alternatively from the group including but not limited to yellow, cyan, and magenta. In general an uncured inkjet ink composition in accordance with various embodiments does not discriminate with respect to a color thereof, which is generally controlled by the color of the pigment material within the uncured inkjet ink composition.

A second of the primary components of an uncured inkjet ink composition in accordance with various embodiments is an uncured resin composition that includes, but is not necessarily limited to, an uncured silicone resin component.

A third of the primary components of an uncured inkjet ink composition in accordance with various embodiments is a solvent composition that includes, but is not necessarily limited to: (1) a propylene-glycol-ether (such as propylene-glycol-monomethyl-ether and/or polypropylene-glycol-methyl-ether) and (2) diethylene-glycol-dimethyl-ether. The solvent may also comprise propylene-glycol-methyl-ether-acetate and/or polypropylene-glycol-monomethyl-ether-acetate. The solvent can further comprise diethylene-glycol-diethyl-ether.

Among many other components, the solvent may include one or more of the following components, including ethanol, isopropyl alcohol, n-butyl alcohol, isobutyl alcohol, ethylene glycol, glycerol, 3-methoxy-3-methyl-1-butanol, 1,2-propanediol, 1,3-propanediol, 2-ethyl-2-(hydroxymethyl)-1 3-propanediol, 2-butyl-2-ethyl-1,3-propanediol, 2,2-dimethylpropane-1,3-diol, 1,2-butylene glycol, 1,3-butylene glycol, 2,3-butylene glycol, 2,2-dimethyl-1,3-propanediol, 1,5-pentanediol, 2-methyl-1,4-pentadiene, 2,4-diethyl-2,4-pentanediol, 2-butene-1 4-diol, 2,5-hexanediol, 2,5-dimethylhexane-2,5-diol, 2-ethyl-1,3-hexanediol, ethylene glycol dimethyl ether, tetraethylene glycol dimethyl ether, dipropylene glycol dimethyl ether, diethylene glycol dibutyl ether, diethylene glycol monobutyl ether, diethylene glycol dimethyl ether, ethylene glycol diethyl ether, diethylene glycol diethyl ether, diethylene glycol methyl ethyl ether, propylene glycol dimethyl ether, triethylene glycol dimethyl ether, ethylene glycol tertiary butyl ether, ethylene glycol monobutyl ether, propylene glycol tertiary butyl ether, diethylene glycol tertiary butyl ether, propylene glycol monomethyl ether, propylene glycol methyl propylene ether, propylene glycol methyl butyl ether, dipropylene glycol methyl butyl ether, dipropylene glycol methyl propylene ether, ethylene glycol monoethyl ether acetate, diethylene glycol monobutyl ether acetate, diethylene glycol monoethyl ether acetate, propylene glycol methyl ether acetate, dipropylene glycol methyl ether acetate, and/or ethylene glycol monobutyl ether acetate, among many others.

According to an embodiment, the uncured inkjet ink composition can also include a dispersant intended to keep the pigment component particles uniformly suspended even after being mixed into a paste and/or into the uncured inkjet ink composition, and to prevent coagulation or sedimentation. According to an embodiment, a dispersant material may utilize a high molecular weight polyurethane and poly-methyl-methacrylate co-polymer material. As just one example, a polyurethane and/or polymethyl-methacrylate copolymer dispersant suitable for compatibility with an uncured resin component and a solvent composition in accordance with an embodiment is commercially available. According to other embodiments, the dispersant may be or may include one or more of the following, including but not limited to an acrylate copolymer with pigment affinity groups, a high molecular weight block copolymer with pigment affinic groups, a polycarboxylic acid salt of polyamine amides, alkylol ammonium salt of a copolymer with acidic groups, a phosphoric ester salt of a high molecular weight copolymer with pigment-affinity groups, and/or a hydroxy-functional carboxylic acid ester with pigment affinity groups, among others.

According to yet another embodiment, the uncured inkjet ink composition can also include a flow promotor that improves the wetting of an uncured inkjet ink composition onto a substrate, thus preventing de-wetting of the uncured inkjet ink composition from a substrate prior to curing.

According to another embodiment, the inkjet ink composition can also include a surface control agent including but not limited to a polydimethylsiloxane solution, a polyether polyester modified organic siloxane solution, an alkyl modified organic siloxane solution, an acrylate copolymer, a polyacrylate solution, an OH, and/or a polyacrylate copolymer with OH functional groups solution, among others. A degassing agent may be, for example, a polydimethylsiloxane and/or a modified polydimethylsiloxane.

Further details relating to the uncured inkjet ink composition in accordance with various embodiments described and/or otherwise envisioned are as follows.

A pigment material, such as a carbon black particulate pigment material, can have a particle size from approximately 100 to 150 nanometers and can be present at approximately 0.5 to 5 weight percent of the uncured inkjet ink composition. A suitable carbon black particulate pigment material for an uncured inkjet ink composition in accordance with an embodiment is generally commercially available. Several alternative commercially available sources of carbon black particulate pigment material are not precluded in accordance with an embodiment.

As is understood by a person skilled in the art, nanometer-sized particulate pigment materials generally have a higher absorption rate of visible light in comparison with larger size particulate pigment materials, and may thus contribute to high optical density within a coated and cured inkjet ink composition in accordance with an embodiment, while maintaining a desirably low cured inkjet ink composition thickness. Nanometer-sized carbon black particulate pigment materials also have an inhibited scattered reflection of visible light from the carbon black particulate pigment material surfaces, which increases the blackness of a coated and cured inkjet ink composition in accordance with an embodiment.

A color pigment material, including but not limited to a cyan, magenta, yellow, and/or other particulate pigment material, can be present at approximately 1 to 5 weight percent of the uncured inkjet ink composition. A suitable color pigment material for an uncured inkjet ink composition in accordance with an embodiment is generally commercially available. Several alternative commercially available sources of color particulate pigment material are not precluded in accordance with an embodiment.

Some examples of suitable pigments include carbon black, copper phthalocyanine, pigment yellow 17, pigment yellow 83, pigment yellow 93, pigment yellow 110, pigment yellow 150, pigment yellow 151, pigment yellow 180, pigment red 146, pigment red 184, pigment red 208, quiacridone red 122, quiacridone red 202, quiacridone violet 19, and any of these in any combination, among others.

Figure 2:
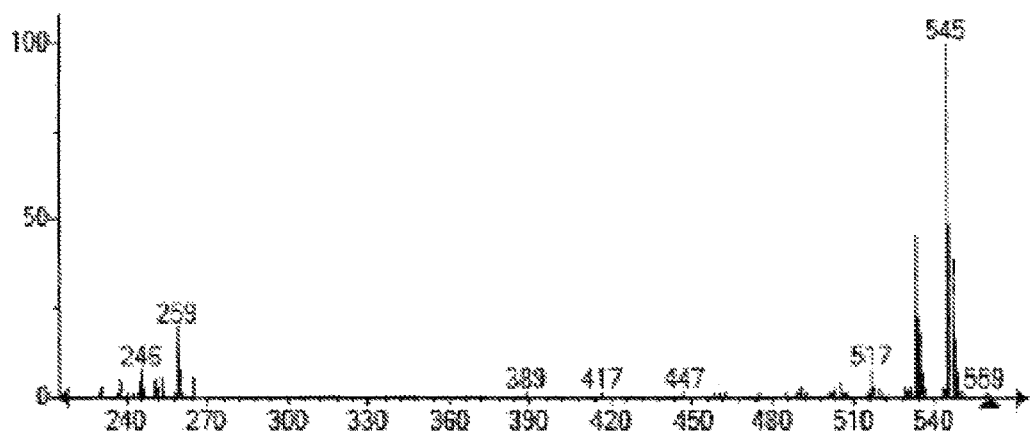
FIG. 2 is a thermal desorption gas chromatogram mass spectroscopy (GC/MS) spectrum of the divinyl-hexamethyl-octasila-silsesquioxane resin component, in accordance with an embodiment.

An uncured silicone resin component within an uncured inkjet ink composition in accordance with an embodiment comprises and may alternatively be defined as a silsesquioxane uncured silicone resin component, and more preferably (but not limited to) a divinyl-hexamethyl-octasila-silsesquioxane uncured silicone resin component ($Vin_2Me_6Si_8$) whose chemical structure is illustrated in FIG. 1. Similarly, FIG. 2 is a thermal desorption gas chromatography mass spectrum of the divinyl-hexamethyl-octasila-silsesquioxane uncured silicone resin component.

As is understood by a person skilled in the art, the $Vin_2Me_6Si_8$ silsesquioxane uncured silicone resin component whose chemical structure is illustrated in FIG. 1 is a condensation product of two molecules of a vinyl-tri-substitutable silane and six molecules of a methyl-tri-substitutable silane. The tri-substitutable portions of the foregoing vinyl silane and methyl silane molecules may comprise, for example and without limitation, substitutable chemical functionality including but not limited to suitable halide functionality and suitable alkoxide functionality. Thus, suitable silane starting materials that may be used for preparing the silsesquioxane uncured silicone resin component whose chemical structure is illustrated in FIG. 1 may include, but are not limited to, vinyl-triethoxy-silane and methyl-trimethoxy-silane. The silsesquioxane uncured silicone resin component whose chemical structure is illustrated in FIG. 1 is present at approximately 20 to 35 weight percent of an uncured inkjet ink composition in accordance with an embodiment. The silsesquioxane uncured silicone resin component whose chemical structure is illustrated in FIG. 1 is further characterized as a transparent viscous fluid having about 30% to about 45% solids, a viscosity from about 10 to about 20 centipoise at 25° C., a density from about 0.9 to about 1.0 gram/$cm^3$ at 23° C., and a surface tension from about 26 to about 29 dynes/cm.

A suitable uncured silicone resin component (i.e., including but not limited to the $Vin_2Me_6Si_8$ silsesquioxane whose chemical structure is illustrated in FIG. 1) for use within an uncured resin composition within an uncured inkjet ink composition in accordance with an embodiment is available from any of several commercial sources as an appropriately designated uncured silicone resin. As noted above, the uncured silicone resin component may alternatively be prepared in-situ from reaction of a 1:3 ratio of an appropriate vinyl silane and an appropriate methyl silane.

The uncured resin composition of an uncured inkjet ink composition in accordance with an embodiment ensures adhesion of the particulate pigment material component (i.e., particularly a carbon black particulate pigment material component) to a substrate (i.e., particularly a glass substrate). Moreover, the uncured resin composition of an uncured inkjet ink composition assists when cured within the context of meeting or surpassing environmental reliability test criteria common with respect to a particular end application of an inkjet ink coated and cured substrate in accordance with an embodiment. The uncured resin composition of an uncured inkjet ink composition in accordance with an embodiment when cured may also ensure and provide additional functional attributes to a cured inkjet ink composition coated article, such as but not limited to solvent resistance and chemical resistance, and desirable electrical resistivity characteristics.

Further, the inorganic uncured silicone resin component of the uncured inkjet ink composition in accordance with an embodiment is desirably selected to provide adequate adhesion to a glass substrate surface, adequate hardness of a cured inkjet ink coating, and adequate dimensional stability after high temperature bake (up to about 250-280° C.). Thus, in accordance with the foregoing an uncured resin component of an uncured inkjet ink composition can be coated upon a substrate using otherwise standard inkjet ink coating apparatus and then desirably thermally cured at 150-200° C. for greater than 10 min (i.e., presuming that the curing is undertaken in a convection oven; shorter cure times may be accessible when using an infrared oven).

To that end, nanometer-sized particulate pigment materials tend to be more electrically conductive than larger-sized particulate pigment materials. Therefore, the uncured resin component within an uncured jet ink composition in accordance with an embodiment are desirably able to fully encase the pigment material particles after curing, and prevent pigment material particle coagulation and resulting loss of electrical resistivity within a cured jet ink composition in accordance with an embodiment.

With respect to the solvent composition within an uncured inkjet ink composition in accordance with an embodiment: (1) a propylene-glycol-ether is present at approximately 10 to 55 weight percent; and (2) diethylene-glycol-dimethyl-ether is present at approximately 10 to 25 weight percent. The foregoing glycol solvents are regarded as generally conventional solvents that require no additional specification and are readily sourced from any of several suppliers at an appropriate purity level for use within an uncured inkjet ink composition in accordance with an embodiment. Moreover, it is anticipated that the solvent composition within an uncured inkjet ink composition in accordance with an embodiment may be characterized using a gas chromatography analysis at 200° C.

In general in accordance with an embodiment, the solvent materials are selected to serve as a carrier for the pigment material particles, enabling the pigment material particles to be uniformly and smoothly ejected from a jet ink print head onto a non-porous substrate, such as but not limited to a glass substrate, a ceramic substrate, and/or a metal oxide substrate. In addition, the foregoing three solvent components also control the drying, fluidic, and wetting properties of the uncured inkjet ink composition, as well as ensuring that the uncured inkjet ink composition viscosity and surface tension does not change with temperature, and thus maintains stable printing performance (e.g., infrequent clogging of print head nozzles).

A dispersant component of the uncured inkjet ink composition is intended to keep the pigment material component particles uniformly suspended even after being mixed into a paste and/or into the uncured inkjet ink composition, and to prevent coagulation or sedimentation. Coagulated pigment material component particles may clog inkjet ink nozzles, cause point defects when printed onto substrates and dramatically reduce electrical resistivity of a cured inkjet ink composition. Nanometer-sized pigment material component particles are more susceptible to coagulation in comparison with larger sized pigment material component particles, due to stronger van der Waal forces, for example.

According to an embodiment, a particular dispersant material uses a high molecular weight polyurethane and poly-methyl-methacrylate co-polymer material. This type of dispersant may have many anchor groups in the copolymer molecule to attach to pigment material particle surfaces, and thus surround a pigment material particle. The dispersant material co-polymer material molecules also have long polymer chains that provide interstitial space for the uncured resin components and the solvent materials in the uncured jet ink composition. A co-polymer dispersant as described above must be compatible with an uncured resin component and a solvent composition in accordance with an embodiment, in order to ensure that the dispersant is fully dissolved and that the dispersant polymer chains are fully extended. Such a full extension of dispersant polymer chains overcomes the van der Waals forces that attract the pigment material particles to each other, and ensures that pigment material particles do not coagulate either while in an uncured inkjet ink composition solution or after curing into a cured inkjet ink composition coating. As just one example, a polyurethane and/or polymethyl-methacrylate copolymer dispersant suitable for compatibility with an uncured resin component and a solvent composition in accordance with an embodiment is commercially available.

According to an embodiment, the dispersant material is intended to keep the pigment material component particles uniformly suspended after being mixed into a paste. Thus, in accordance with an embodiment, the dispersant material is mixed with the pigment material at the time of manufacture of the pigment material, or shortly thereafter, and thus pigment comprising a dispersant suitable for compatibility with an uncured resin component and a solvent composition in accordance with an embodiment is commercially available.

According to an embodiment, the dispersant material is mixed, ground into, or otherwise combined with one or more pigments to make a pigment paste. The pigment paste, with the dispersant material pre-mixed, can be commercially available in accordance with an embodiment. The pigment paste can be mixed with the resin component and the solvent mixture, or mixed with a pre-combined mixture of the resin and solvent, to form the uncured inkjet ink composition.

With respect to a flow promoter component within the uncured inkjet ink composition, in accordance with an embodiment the flow promoter in particular improves the wetting of the uncured inkjet ink composition onto a glass substrate, a ceramic substrate, and/or a metal oxide substrate, thus preventing de-wetting of the uncured inkjet ink composition from a substrate prior to curing. According to an embodiment, the flow promoter component comprises a polyether-modified poly-dimethyl-siloxane material, and/or a polyether-modified methylalkylpolysiloxane, present at approximately 0.5 to 3.5 weight percent of an uncured inkjet ink composition in accordance with an embodiment. A flow promoter that may be used within the context of an uncured inkjet ink composition in accordance with an embodiment is generally commercially available.

Provided in Tables 1 and 2 are variations of an uncured cyan inkjet ink composition in accordance with several embodiments.

TABLE 1

Cyan Inkjet Ink Compositions

| Component | Cyan #1 (weight percent) | Cyan #2 (weight percent) |
|---|---|---|
| Pigment material (cyan) | 2.6-5.0 | 1.0-2.0 |
| Dispersant | 2.0-4.0 | 0.5-2.0 |
| Inorganic resin | 20.0-35.0 | 20.0-35.0 |
| Propylene glycol monomethyl ether | 40.0-55.0 | 40.0-55.0 |
| Diethylene glycol dimethyl ether | 10.0-20.0 | 10.0-20.0 |
| Propylene glycol methyl ether acetate | 10.0-15.0 | 10.0-15.0 |
| Flow promoter | 0.5-3.5 | 0.5-3.5 |

TABLE 2

Cyan Inkjet Ink Compositions

| Component | Cyan #1 (weight percent) | Cyan #2 (weight percent) |
|---|---|---|
| Pigment material (cyan) | 2.6-5.0 | 1.0-2.0 |
| Dispersant | 2.0-4.0 | 0.5-2.0 |
| Inorganic resin | 20.0-35.0 | 20.0-35.0 |
| Polypropylene glycol methyl ether | 10.0-30.0 | 10.0-30.0 |
| Diethylene glycol dimethyl ether | 10.0-25.0 | 10.0-25.0 |
| Polypropylene glycol monomethyl ether acetate | 10.0-15.0 | 10.0-15.0 |
| Diethylene glycol diethyl ether | 10.0-25.0 | 10.0-25.0 |
| Flow promoter | 0.5-3.5 | 0.5-3.5 |

Provided in Tables 3 and 4 are variations of an uncured magenta inkjet ink composition in accordance with several embodiments.

TABLE 3

Magenta Inkjet Ink Compositions

| Component | Magenta #1 (weight percent) | Magenta #2 (weight percent) |
|---|---|---|
| Pigment material (magenta) | 2.8-5.0 | 1.0-2.0 |
| Dispersant | 2.0-4.0 | 0.5-2.0 |
| Inorganic resin | 20.0-35.0 | 20.0-35.0 |
| Propylene glycol monomethyl ether | 40.0-55.0 | 40.0-55.0 |
| Diethylene glycol dimethyl ether | 10.0-20.0 | 10.0-20.0 |
| Propylene glycol methyl ether acetate | 10.0-15.0 | 10.0-15.0 |
| Flow promoter | 0.5-3.5 | 0.5-3.5 |

TABLE 4

Magenta Inkjet Ink Compositions

| Component | Magenta #1 (weight percent) | Magenta #2 (weight percent) |
|---|---|---|
| Pigment material (cyan) | 2.8-5.0 | 1.0-2.0 |
| Dispersant | 2.0-4.0 | 0.5-2.0 |
| Inorganic resin | 20.0-35.0 | 20.0-35.0 |
| Polypropylene glycol methyl ether | 10.0-30.0 | 10.0-30.0 |
| Diethylene glycol dimethyl ether | 10.0-25.0 | 10.0-25.0 |
| Polypropylene glycol monomethyl ether acetate | 10.0-15.0 | 10.0-15.0 |
| Diethylene glycol diethyl ether | 10.0-25.0 | 10.0-25.0 |
| Flow promoter | 0.5-3.5 | 0.5-3.5 |

Provided in Tables 5 and 6 are variations of an uncured yellow inkjet ink composition in accordance with several embodiments.

TABLE 5

Yellow Inkjet Ink Compositions

| Component | Yellow #1 (weight percent) |
|---|---|
| Pigment material (yellow) | 2.8-5.0 |
| Dispersant | 2.0-4.0 |
| Inorganic resin | 20.0-35.0 |
| Propylene glycol monomethyl ether | 40.0-55.0 |
| Diethylene glycol dimethyl ether | 10.0-20.0 |
| Propylene glycol methyl ether acetate | 10.0-15.0 |
| Flow promoter | 0.5-3.5 |

TABLE 6

Yellow Inkjet Ink Compositions

| Component | Yellow #1 (weight percent) |
|---|---|
| Pigment material (cyan) | 2.8-5.0 |
| Dispersant | 2.0-4.0 |
| Inorganic resin | 20.0-35.0 |
| Polypropylene glycol methyl ether | 10.0-30.0 |
| Diethylene glycol dimethyl ether | 10.0-25.0 |
| Polypropylene glycol monomethyl ether acetate | 10.0-15.0 |
| Diethylene glycol diethyl ether | 10.0-25.0 |
| Flow promoter | 0.5-3.5 |

Provided in Tables 7 and 8 are variations of an uncured yellow inkjet ink composition in accordance with various embodiments.

TABLE 7

Black Inkjet Ink Compositions

| Component | Carbon black #1 (weight percent) | Carbon black #2 (weight percent) | Carbon black #3 (weight percent) |
|---|---|---|---|
| Pigment material (carbon black) | 2.6-5.0 | 1.0-2.0 | 0.5-1.0 |
| Dispersant | 2.0-4.0 | 1.0-2.0 | 1.0-2.0 |
| Inorganic resin | 20.0-35.0 | 20.0-35.0 | 20.0-35.0 |
| Propylene glycol monomethyl ether | 40.0-55.0 | 40.0-55.0 | 40.0-55.0 |
| Diethylene glycol dimethyl ether | 10.0-20.0 | 10.0-20.0 | 10.0-20.0 |
| Propylene glycol methyl ether acetate | 10.0-15.0 | 10.0-15.0 | 10.0-15.0 |
| Flow promoter | 0.5-3.5 | 0.5-3.5 | 0.5-3.5 |

TABLE 8

Black Inkjet Ink Compositions

| Component | Carbon black (weight percent) |
|---|---|
| Pigment material (cyan) | 2.6-5.0 |
| Dispersant | 2.0-4.0 |
| Inorganic resin | 20.0-35.0 |
| Polypropylene glycol methyl ether | 10.0-30.0 |
| Diethylene glycol dimethyl ether | 10.0-25.0 |
| Polypropylene glycol monomethyl ether acetate | 10.0-15.0 |
| Diethylene glycol diethyl ether | 10.0-25.0 |
| Flow promoter | 0.5-3.5 |

Beyond the foregoing components including the pigment component, the resin component, and the solvent composition, an uncured inkjet ink composition in accordance with an embodiment may also further comprise one or more other additives that may be otherwise conventional or unconventional within the context of uncured inkjet ink compositions. Such additional additives may include, but are not necessarily limited to, a resin strengthener that may be present up to approximately 3 percent and comprise a conventional composition.

An uncured inkjet ink composition in accordance with an embodiment may be prepared by mixing the foregoing components in any order, until a uniform suspension of the uncured inkjet ink composition is obtained. Typically and preferably, the sum of the components is mixed and appropriately adjusted to provide an uncured inkjet ink composition that has a viscosity from about 4 to about 6 centipoise at 25 degrees Celsius.

Inkjet Ink Composition Coating Methods

An inkjet ink coating method in accordance with an embodiment parallels generally the inkjet ink composition in accordance with the above description. Thus, an uncured inkjet ink composition is first coated upon a substrate, the uncured inkjet ink composition comprising: (1) a pigment material, such as carbon black, cyan, magenta, yellow, and/or other colored pigment material; (2) an inorganic resin component, such as a silsesquioxane material; and (3) a solvent composition comprising a propylene-glycol-ether (such as propylene-glycol-monomethyl-ether and/or polypropylene-glycol-methyl-ether) and diethylene-glycol-dimethyl-ether. The solvent may also comprise, for example propylene-glycol-methyl-ether-acetate and/or polypropylene-glycol-monomethyl-ether-acetate, and/or diethylene-glycol-diethyl-ether, among other components. The uncured inkjet ink composition may also include a dispersant component and/or a flow promoter, such as a polyether-modified siloxane material. Next, the uncured inkjet ink composition is cured in-situ upon the substrate to form a cured inkjet ink composition coating upon the substrate. In some embodiments, the inkjet ink composition is applied directly to the surface of the substrate (e.g., without previous application of a primer). In other embodiments, a primer may be applied to the surface of the substrate prior to applying the inkjet ink composition to assist in adhesion of the ink to the surface of the substrate.

According to an embodiment, the coating method could first include the step of formulating the uncured inkjet ink composition. Generating or formulating the uncured inkjet ink composition could include, for example, the step of combining or mixing the pigment material, the inorganic resin component, and the solvent composition. The step of generating or formulating the uncured inkjet ink composition could also include a prior step of mixing grinding into, or otherwise combining a dispersant with one or more pigments to make a pigment paste. The pigment paste, with the dispersant material pre-mixed, can be commercially available in accordance with an embodiment. The pigment paste can be mixed with the resin component and the solvent mixture, or mixed with a pre-combined mixture of the resin and solvent, to form the uncured inkjet ink composition.

Within an embodiment, the uncured inkjet ink composition is preferably thermally cured to form the cured inkjet ink composition coating. Such thermal curing of the uncured inkjet ink composition to provide the cured inkjet ink composition coating is typically undertaken at a temperature from about 160 to about 250 degrees Celsius, and for a time period from about 1 to about 20 minutes, in an inert atmosphere. Such curing conditions may also depend on whether one uses a convection oven or an infrared oven.

Consistent with aspects of an embodiment as discussed above, an uncured inkjet ink composition in accordance with an embodiment is coated and cured upon a substrate selected from the group including but not limited to a glass substrate, a ceramic substrate, and/or a metal oxide substrate, among others. Particular end product applications of such substrates are varied.

The foregoing substrate selection options and uncured inkjet ink composition coating and thermal processing curing conditions are not intended to limit an embodiment with respect to any particular functional end result. Rather, an embodiment intend and expect that alternative thermal processing curing conditions may be accessed to realize specific thermally cured inkjet ink composition coated substrates.

Cured Inkjet Ink Composition Coated Articles

Following in sequence from the foregoing uncured inkjet ink composition and method for coating the foregoing inkjet ink composition to provide a cured inkjet ink composition coated article, is the cured inkjet ink composition coated article itself. Such a cured inkjet ink coated article includes a substrate as well as the cured inkjet ink composition coating located upon the substrate. The cured coating includes a pigment, as well as a cured inorganic resin binder composition. Desirably, within a coated article in accordance with an embodiment the substrate is selected from the group consisting of a glass substrate, a ceramic substrate, and/or a metal oxide substrate, among others. In some embodiments, the coated article may be incorporated into an electronic device as part of a housing or as a cover assembly. In some embodiments, the electronic device may include, but is not limited to, a mobile phone, a laptop, or a tablet.

According to an embodiment, the cured coating has a thickness from approximately 2 to 6 microns or 1.5 to 5 microns. According to an embodiment, the cured coating has an optical density from approximately 3 to 5.5. According to an embodiment, within the cured coating the pigment component particles are regularly arranged. Finally, the cured inkjet ink resin composition within the cured coated article in accordance with an embodiment may be chemically characterized using standard methodology.

It will be apparent to those skilled in the art that various modifications and variations can be made without departing from the spirit or scope of the claims.

What is claimed is:

1. An ink composition comprising:
   a pigment material;
   an inorganic resin component comprising a silsesquioxane, wherein said silsesquioxane is divinyl-hexamethyl-octasila-silsesquioxane; and a solvent composition comprising a propylene-glycol-ether and diethylene-glycol-dimethyl-ether.

2. The ink composition of claim 1, wherein the solvent composition further comprises propylene-glycol-methyl-ether-acetate.

3. The ink composition of claim 1, wherein the solvent composition further comprises polypropylene-glycol-monomethyl-ether-acetate.

4. The ink composition of claim 1, wherein the solvent composition further comprises diethylene-glycol-diethyl-ether.

5. The ink composition of claim 1, wherein the propylene-glycol-ether is propylene-glycol-monomethyl-ether.

6. The ink composition of claim 1, wherein the propylene-glycol-ether is polypropylene-glycol-methyl-ether.

7. The ink composition of claim 1, further comprising:
a dispersant; and
a flow promoter.

8. The ink composition of claim 1, wherein the pigment material is selected from the group consisting of black, cyan, magenta, yellow, and combinations thereof.

9. The ink composition of claim 7, wherein said flow promoter comprises polyether-modified methylalkylpolysiloxane.

10. The ink composition of claim 7, wherein said flow promoter comprises modified polyether polydimethylsiloxane.

11. The ink composition of claim 7, wherein:
the pigment material is present at approximately 0.5 to 5 weight percent;
the dispersant is present at approximately 0.5 to 4.0 weight percent;
the inorganic resin component is present at approximately 20 to 35 weight percent;
the solvent composition comprises a propylene-glycol-ether present at approximately 10 to 55 weight percent and diethylene-glycol-dimethyl-ether present at approximately 10 to 25 weight percent; and
the flow promoter is present at approximately 0.5 to 3.5 weight percent.

12. An ink coating method comprising the steps of:
coating upon a substrate an uncured inkjet ink composition comprising: (i) a pigment material; (ii) an inorganic resin component comprising a silsesquioxane, wherein said silsesquioxane is divinyl-hexamethyl-octasila-silsesquioxane; and (iii) a solvent composition comprising a propylene-glycol-ether and diethylene-glycol-dimethyl-ether; and
curing in-situ the uncured inkjet ink composition to form a cured ink composition upon the substrate.

13. The method of claim 12, wherein the solvent composition of the uncured inkjet ink composition further comprises propylene-glycol-methyl-ether-acetate.

14. The method of claim 12, wherein the solvent composition of the uncured inkjet ink composition further comprises polypropylene-glycol-monomethyl-ether-acetate.

15. The method of claim 12, wherein the solvent composition further comprises diethylene-glycol-diethyl-ether.

16. The method of claim 12, wherein the propylene-glycol-ether is propylene-glycol-monomethyl-ether.

17. The method of claim 12, wherein the propylene-glycol-ether is polypropylene-glycol-methyl-ether.

18. The method of claim 12, wherein the uncured inkjet ink composition further comprises a dispersant and a flow promoter.

19. The method of claim 18, wherein said flow promoter comprises polyether-modified methylalkylpolysiloxane.

20. The method of claim 18, wherein said flow promoter comprises modified polyether polydimethylsiloxane.

21. The method of claim 12, wherein the pigment material is selected from the group consisting of black, cyan, magenta, yellow, and combinations thereof.

22. The method of claim 12, wherein the substrate is selected from the group consisting of a glass substrate, a ceramic substrate, a metal oxide substrate, a metal substrate, and a polymeric substrate.

23. The method of claim 12, wherein the uncured inkjet ink composition is thermally cured to form the cured ink composition.

24. A coated article, the coated article comprising:
a substrate; and
a cured coating located upon the substrate, the cured coating is formed from an ink composition comprising: (i) a pigment material; (ii) an inorganic resin component comprising a silsesquioxane, wherein said silsesquioxane is divinyl-hexamethyl-octasila-silsesquioxane; and (iii) a solvent composition comprising a propylene-glycol-ether and diethylene-glycol-dimethyl-ether.

25. The coated article of claim 24, wherein the solvent composition further comprises propylene-glycol-methyl-ether-acetate.

26. The coated article of claim 24, wherein the solvent composition further comprises polypropylene-glycol-monomethyl-ether-acetate.

27. The coated article of claim 24, wherein the solvent composition further comprises diethylene-glycol-diethyl-ether.

28. The coated article of claim 24, wherein the propylene-glycol-ether is propylene-glycol-monomethyl-ether.

29. The coated article of claim 24, wherein the propylene-glycol-ether is polypropylene-glycol-methyl-ether.

30. The coated article of claim 24, wherein said ink composition further comprises a dispersant and a flow promoter.

31. The coated article of claim 24, wherein the pigment material is selected from the group consisting of black, cyan, magenta, yellow, and combinations thereof.

32. The coated article of claim 24, wherein the cured coating has a thickness of approximately 2 to 6 microns.

33. An electronic device comprising the coated article of claim 24.

* * * * *

UNITED STATES PATENT AND TRADEMARK OFFICE
CERTIFICATE OF CORRECTION

PATENT NO. : 10,435,572 B2 Page 1 of 1
APPLICATION NO. : 15/071936
DATED : October 8, 2019
INVENTOR(S) : Fang-Fang Wang et al.

It is certified that error appears in the above-identified patent and that said Letters Patent is hereby corrected as shown below:

On the Title Page

In Column 1, item (73), Assignee, Line 2, delete "NJ" and insert -- NY --, therefor.

Signed and Sealed this
Seventh Day of April, 2020

Andrei Iancu
*Director of the United States Patent and Trademark Office*